(12) United States Patent
Tsutsui et al.

(10) Patent No.: US 6,265,324 B1
(45) Date of Patent: Jul. 24, 2001

(54) METHOD OF MANUFACTURING SEMICONDUCTOR DEVICE AND MASK FOR FORMING THIN FILM PATTERN

(75) Inventors: Tsuyoshi Tsutsui; Shunji Nakata; Yasuo Miyano; Koutarou Ogura, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/315,234

(22) Filed: May 20, 1999

(30) Foreign Application Priority Data

May 21, 1998 (JP) .................................................. 10-177956
Dec. 15, 1998 (JP) .................................................. 10-355881

(51) Int. Cl.[7] .......................... H01L 21/31; H01L 21/469

(52) U.S. Cl. .............................. 438/758; 438/22; 438/584

(58) Field of Search .............................. 438/758, 22, 584

(56) References Cited

U.S. PATENT DOCUMENTS 5,406,095 * 4/1995 Koyama et al. .

* cited by examiner

*Primary Examiner*—Kevin M. Picardat
*Assistant Examiner*—D. M. Collins
(74) *Attorney, Agent, or Firm*—Morgan, Lewis & Bockius LLP

(57) ABSTRACT

A mask 11 for vapor deposition is made of glass. Through-holes 15 are formed in the glass mask 11 so that they make a prescribed pattern on the surface of a semiconductor substrate 4. The peripheral wall of the through-hole is tapered so that the opening face 15b from which evaporated atoms are introduced is larger than the opening face 15a facing the deposition surface of the semiconductor substrate. The evaporated metal atoms having flied aslant toward the opening face 15b from which the evaporated atoms are introduced can pass through the through-hole 14 so that the evaporated metal atoms are deposited on the deposition surface of the semiconductor substrate. A desired thin film pattern inclusive of an electrode pattern can be easily formed on the surface of a semiconductor substrate, thereby improving the production yield of a semiconductor device.

13 Claims, 11 Drawing Sheets

METHOD OF MANUFACTURING SEMICONDUCTOR DEVICE AND MASK FOR FORMING THIN FILM PATTERN

BACKGROUND OF THE INVENTION

1. Field of the Invention

The present invention relates to a method of manufacturing a semiconductor device and a mask used to form a thin film pattern.

2. Description of the Related Art

A semiconductor light-emitting element (LED) is generally used which includes an N-type GaP layer and a P-type Gap layer stacked in order on a semiconductor, e.g. GaP substrate and an electrode of e. g. Au formed on the P-type GaP layer. Such a semiconductor light-emitting element can be manufactured as follows. First, a semiconductor wafer (hereinafter also referred to as "semiconductor substrate") is prepared by stacking the N-type GaP layer and P-type GaP layer in order on the surface of the GaP substrate. In this state, electrodes each having a prescribed diameter are arranged at a prescribed pitch on the front surface of the semiconductor substrate on the side of the P-type GaP layer. Electrodes are also arranged on the back surface of the semiconductor substrate. The semiconductor substrate is diced into plural pieces each having a single (P-type) electrode on the front surface and plural electrodes on the back surface. The electrodes are formed with a mask having through-holes mounted on the semiconductor substrate within a metallic vacuum.

FIG. 21 shows a schematic configuration of a vacuum deposition apparatus for forming electrodes. Within a bell jar (deposition vessel) with an evaporation source such as a pot arranged at a predetermined position, a fixed stand 3 is arranged so that it can swing within a prescribed angle with respect to the deposition source 2. A semiconductor substrate 4 and a metallic mask 5 are mounted on the fixed stand 3. The evaporated metal having flied from the evaporation source is deposited on the surface of the semiconductor substrate 4 exposed within through-holes. In the above process, the semiconductor substrate 4 is placed on the fixed stand 3 and the metallic mask 5 having a diameter equal to that of the semiconductor substrate and through-holes each having a prescribed shape made at a prescribed pitch is arranged on the semiconductor substrate 4. Using pins or the like, the metallic mask 5 and semiconductor substrate 4 are fixed on the fixed stand 3 at plural positions in the vicinity of the edge of the metallic mask 5. Although not shown, a spacer is arranged between the metallic mask 5 and semiconductor substrate 4 as occasion demands.

In this state, when the evaporation source 2 is heated, metallic atoms 7 evaporated from the evaporation source 2 fly toward the metallic mask 5. As seen from FIG. 22 which is a partially enlarged sectional view of the metallic mask 5 and semiconductor substrate 4, the metallic atoms are deposited on the semiconductor substrate 4 through through-holes 8 made in the metallic mask 5. Thus, the electrodes 9 each having a prescribed shape are formed at a prescribed pitch on the semiconductor substrate 4.

In the case of the LED element, each of the through-holes 8 of the metallic mask 5 corresponds to the electrode of each LED element. In the case of an IC, a plurality of electrodes are often formed on a single chip. In this case, several through-holes of the metallic mask 5 are formed within a single IC element so as to correspond to its electrodes.

The metallic mask 5 is as thin as several tens of $\mu$m so that it expands owing to heat from the evaporation source 2. Thus, it becomes deformed in various shapes, for example, its central portion swells. If the metallic mask 5 becomes deformed, the semiconductor substrate 4 may be greatly separated from the metallic mask 5 and the locations of the through-holes of the metallic mask 5 may vary momently. Therefore, it is difficult to form electrodes precisely so that they are located at prescribed positions so as to have prescribed shapes.

During the deposition, the metallic mask 5 is liable to suffer from heat. The metallic mask 5, which has a larger thermal expansion coefficient than that of the semiconductor substrate 4, is apt to expand. If it has a large size to provide a wide free region, it is more likely to become deformed. In order to minimize such a deformation of the metallic mask 5, the metallic mask 5 is commonly formed to have a size equal to that of the semiconductor substrate 4 Therefore, when the metallic mask 5 is fixed, in alignment with the semiconductor substrate 4, on the fixed stand 3, the fixing pins 6 are also located on the semiconductor substrate 4. Thus, no deposition is made on the surface of the semiconductor substrate 4 where the pins 6 are located. This leads to reduction in the production yield in the electrodes. The present invention has been accomplished in order to solve the problem described above.

SUMMARY OF THE INVENTION

An object of the present invention is to provide a method of manufacturing a semiconductor device which can easily form a thin film pattern for an electrode with high precision on a semiconductor substrate surface to improve the production yield of the electrode, and a deposition mask used for this method.

In order to attain the above object, in accordance with a first aspect of the present invention, there is provided a method for manufacturing a semiconductor device comprising the steps: fixing a glass mask having a though-hole superposed on a surface of a semiconductor substrate; and arranging the glass mask and semiconductor substrate within a material gas containing material particles so that the material gas is passed through the through-hole and brought into contact with the surface of the semiconductor substrate to form a thin film pattern.

In accordance with the present invention, a through-hole each having a prescribed shape is formed at a prescribed position of a glass plate to form a glass mask. The glass mask superposed on a semiconductor substrate for forming a semiconductor device is fixed and arranged within an atmosphere of a material gas such as metal vapor. The material gas containing at least material particles is passed through the through-hole of the glass mask so that it is deposited in a prescribed shape at a prescribed position of the semiconductor substrate. In this way, a thin film pattern such as an electrode can be formed at a necessary position of the semiconductor device.

In this method, the glass plate with the through-hole having a prescribed shape at a prescribed position is used as a material of the mask for forming a thin film pattern. The mask has a very small thermal expansion coefficient so that its shape is not almost changed. For this reason, a precise electrode having a prescribed shape can be easily formed at a prescribed position. The glass mask, which has a very small thermal expansion coefficient, is difficult to warp. Therefore, the glass mask can have a larger size than that of the semiconductor substrate. Where the glass mask as well as the semiconductor substrate is fixed on a fixed stand for vapor deposition, it is not necessary to attach any fixing means on the semiconductor substrate, thereby improving the production yield of the semiconductor device.

In accordance with the second aspect of the present invention, the method of manufacturing a semiconductor device according to first aspect is characterized in that the material gas is metal vapor and the metal vapor is brought into contact with the surface of the semiconductor substrate through the glass maskto form a thin film pattern.

In accordance with the third aspect of the present invention, the method of manufacturing a semiconductor device according to the first aspect is characterized in that the material gas is refractory metal vapor and the refractory metal vapor is brought into contact with the surface of the semiconductor substrate through the glass mask to form a refractory metal thin film pattern.

Where a film of metal, particularly refractory metal is formed, the mask is likely to become deformed due to the high temperature of the semiconductor device. The thin film pattern could not be formed with high accuracy. However, in accordance with the method of the present invention, the thin film pattern can be easily formed with high accuracy.

In accordance with the fourth aspect of the present invention, the method of manufacturing a semiconductor device according to the first aspect is characterized in that the semiconductor substrate includes a layer of compound semiconductor selected from the group consisting of GaAs, GaP or InP, the material gas is metal vapor, and the metal vapor is brought into contact with the surface of the semiconductor substrate through the glass mask to form an electrode pattern.

In accordance with the fifth aspect of the present invention, the method of manufacturing a semiconductor device according to the first aspect is characterized in that the semiconductor substrate includes a layer of compound semiconductor selected from the group consisting of GaAs, GaP or InP to form an LED element, the glass mask includes a plurality of through-holes arranged regularly each having substantially the same diameter, the material gas is metal vapor, and the metal vapor is brought into contact with the surface of the semiconductor substrate through the glass mask to form an electrode pattern.

When lithography is used for making an electrode pattern, the surface state of the region with an electrode metal removed in the compound semiconductor layer used for an LED is changed so that the characteristic may be deteriorated and the production yield may be reduced. Therefore, in many cases, the lithography cannot be adopted for patterning of the mask. However, according to the method of the present invention, the glass mask is simply placed on the surface of the semiconductor substrate so that the pattern can be easily formed with high accuracy while maintaining the characteristic of the device.

In accordance with the sixth aspect of the present invention, the method of manufacturing a semiconductor device according to the fifth aspect is characterized in that the glass mask includes the plurality of through-holes arranged at a higher density on its periphery than at its center.

Where a larger number of regular patterns each having the same size must be formed like the electrode pattern of the LED element, the through-holes are arranged at a higher density on the periphery, taking into consideration the warp in the neighborhood of the center. Therefore, even when the center portion is warped so that the electrode patterns are formed in a contracted state on the semiconductor substrate, since the through-holes are formed at a higher density on the periphery, the same patterns can be formed at the same pitch over the entire surface of the semiconductor substrate.

In accordance with the seventh aspect of the present invention, the method of manufacturing a semiconductor device according to the fifth aspect is characterized in that the glass mask includes the plurality of through-holes each having a larger diameter on its periphery than at its center.

Where the electrode pattern having a larger diameter for the pitch is formed, the size of the pattern rather than the pitch greatly contributes to the uniformity of the electrode patterns. In this case, the diameter of the through-hole can be adjusted to form the electrode patterns uniformly at high precision.

In accordance with the eighth aspect of the present invention, the method of manufacturing a semiconductor device according to the sixth aspect is characterized in that the glass mask includes the plurality of through-holes each having a larger diameter on its periphery than at its center.

By adjusting both diameter and pitch, the electrode patterns can be uniformly formed at higher precision.

In accordance with the ninth aspect of the present invention, the method of manufacturing a semiconductor device according to the first aspect is characterized in that the semiconductor substrate and the glass mask superposed thereon are fixed on a stand which can swing.

By forming the thin film patterns while the semiconductor substrate is swung, they can be formed more uniformly.

In accordance with the tenth aspect of the present invention, the method of manufacturing a semiconductor device according to the first aspect is characterized in that the glass film is fixed on a supporting stand by means of an elastic member.

In this manner, the glass mask can be easily attached to the semiconductor substrate and brought into intimate contact with the semiconductor substrate.

In accordance with the eleventh aspect of the present invention, the method of manufacturing a semiconductor device according to the tenth aspect is characterized in that the glass mask is fixed on the supporting stand by means of an attaching means formed so as to extend from an outer periphery of the semiconductor substrate.

In this manner, since the glass mask has a smaller thermal expansion coefficient, even when it is fixed on the supporting stand by means of the attaching means formed so as to extend from the periphery of the semiconductor substrate, the thin film pattern can be formed with no deformation at high precision.

In accordance with the twelfth aspect of the present invention, the method of manufacturing a semiconductor device is characterized in that the semiconductor substrate is placed on supporting stand whose center portion is higher than the other portion in their positions, the glass mask is superposed on the semiconductor substrate, the glass mask is fixed, together with the semiconductor substrate, at positions outside an periphery of the semiconductor substrate.

In this manner, even when the glass mask becomes deformed so that its center portion is convex, since the semiconductor substrate is also fixed so that its center portion is convex, the glass mask is kept in intimate contact with the semiconductor substrate during film deposition, thus preventing the pattern accuracy from being lowered. Therefore, the electrode pattern can be formed at high precision.

In accordance with the thirteenth aspect of the present invention, the method of manufacturing a semiconductor device according to the first aspect is characterized in that the material gas is evaporated from a plurality of evaporation sources, and flies substantially perpendicular to the semiconductor substrate.

In this manner, the thin film patterns accurately corresponding to the through-holes can be formed.

In accordance with the fourteenth aspect of the present invention, there is provided a glass mask for forming thin film patterns including a plurality of through-holes, wherein it is fixed in a state superposed on a surface of a semiconductor substrate, and a material gas containing at least material particles passed through the through-holes are brought into contact with the surface of the semiconductor substrate to form thin film patterns.

In accordance with the fifteenth aspect of the present invention, the glass mask for forming thin film patterns according to the fourteenth aspect is characterized in that a peripheral wall of each the through-holes is tapered so that its opening face on the side from which material gas is introduced is larger than its opening face on the side facing the semiconductor substrate.

Generally, in order to maintaining the strength, the glass mask must be thicker than a metallic mask for deposition. However, in accordance with the fifteenth aspect, the peripheral wall of each the through-holes of the glass mask is tapered so that its opening face on the side from which material gas is introduced is larger than its opening face on the side facing the semiconductor substrate. Therefore, the evaporated atoms having flied aslant can be reached the semiconductor substrate. Further, the condition can be relaxed for adjusting the deposition face of the semiconductor substrate or zones for generating the evaporated atoms so that the evaporated atoms to be deposited fly vertically.

In accordance with the sixteenth aspect of the present invention, the glass mask according to the fourteenth aspect is characterized in that the peripheral wall of the through-hole is composed of: a tapered face formed so that its opening face on the side from which material gas is introduced is larger than its opening face on the side facing the semiconductor substrate; and a vertical face formed so that a peripheral edge of the opening face on the side facing the semiconductor substrate is vertically uprighted.

In this configuration, the evaporated atoms captured from a wide area are guided through the tapered face, and further guided vertically through the vertical face toward the surface of the semiconductor substrate. Thus, the thin film pattern can be formed with higher accuracy.

In accordance with the seventeenth aspect of the present invention, the glass mask according to the fourteenth aspect is characterized by further comprising a means for discriminating a front surface thereof from a back surface thereof.

In this case, if the peripheral edge of the opening face on the side facing the semiconductor substrate is vertically uprighted, the acute corner is prevented from being cracked. Further, the means for discriminating a front surface from a back surface of the glass mask is provided so that the front surface and back surface of the glass mask with the tapered through-holes can be correctly recognized.

In accordance with the eighteenth aspect of the present invention, the glass mask according to the fourteenth aspect is characterized in that it includes the plurality of through-holes arranged at a higher density on its periphery than at its center.

In this configuration, even when the center is warped so that the electrode patterns are formed in a contracted state on the semiconductor substrate, since the through-holes are formed at a higher density on the periphery, the same patterns can be formed at the same pitch over the entire surface of the semiconductor substrate.

In accordance with the nineteenth aspect of the present invention, the glass mask according to the fourteenth aspect is characterized in that it includes the plurality of through-holes each having a larger diameter on its periphery than at its center.

Where the electrode pattern having a larger diameter for the pitch is formed, the size of the pattern rather than the pitch greatly contributes to the uniformity of the electrode patterns. In this case, the diameter of the through-hole can be adjusted to form the electrode patterns uniformly at high precision.

In accordance with the twentieth aspect of the present invention, the glass mask according to the eighteenth aspect is characterized in that it includes the plurality of through-holes each having a larger diameter on its periphery than at its center.

By adjusting both diameter and pitch, the electrode pattern can be uniformly formed at higher precision.

The above and other objects and features of the present invention will be more apparent from the following description taken in conjunction with the accompanying drawings.

DESCRIPTION OF THE PREFERRED EMBODIMENTS

Figure 1:
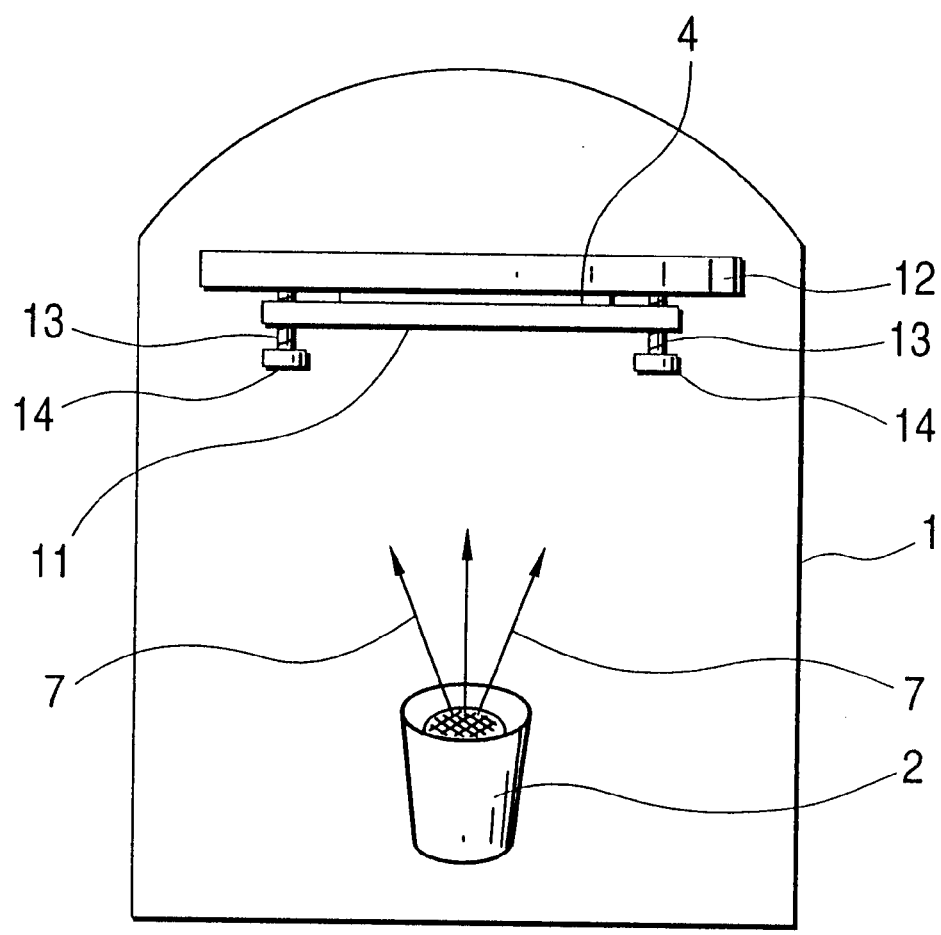
FIG. 1 is a schematic plan view of a deposition apparatus according to an embodiment of the present invention.
Figure 2:
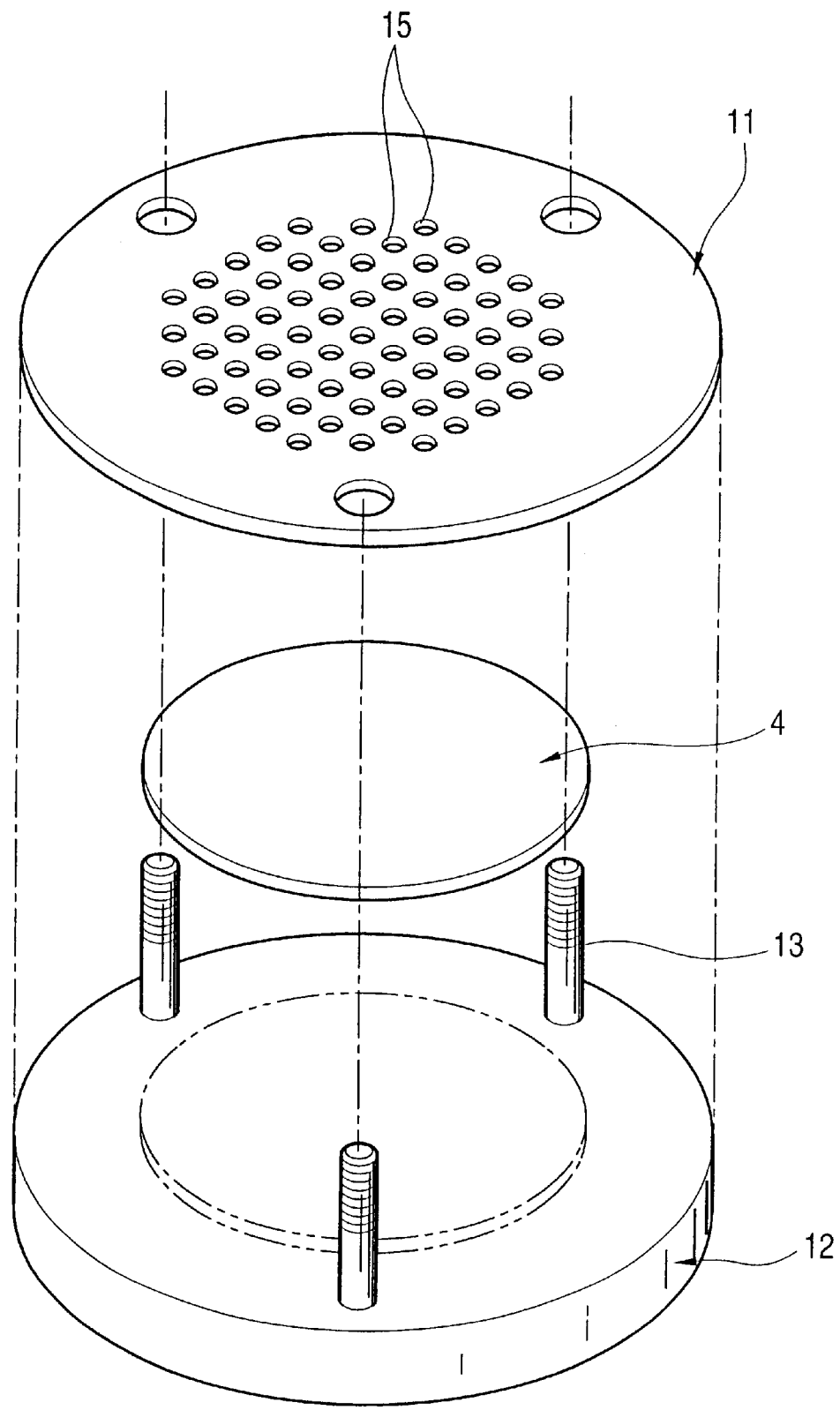
FIG. 2 is a perspective view showing the fixed state of a glass mask and a semiconductor substrate in the embodiment.
Figure 3:
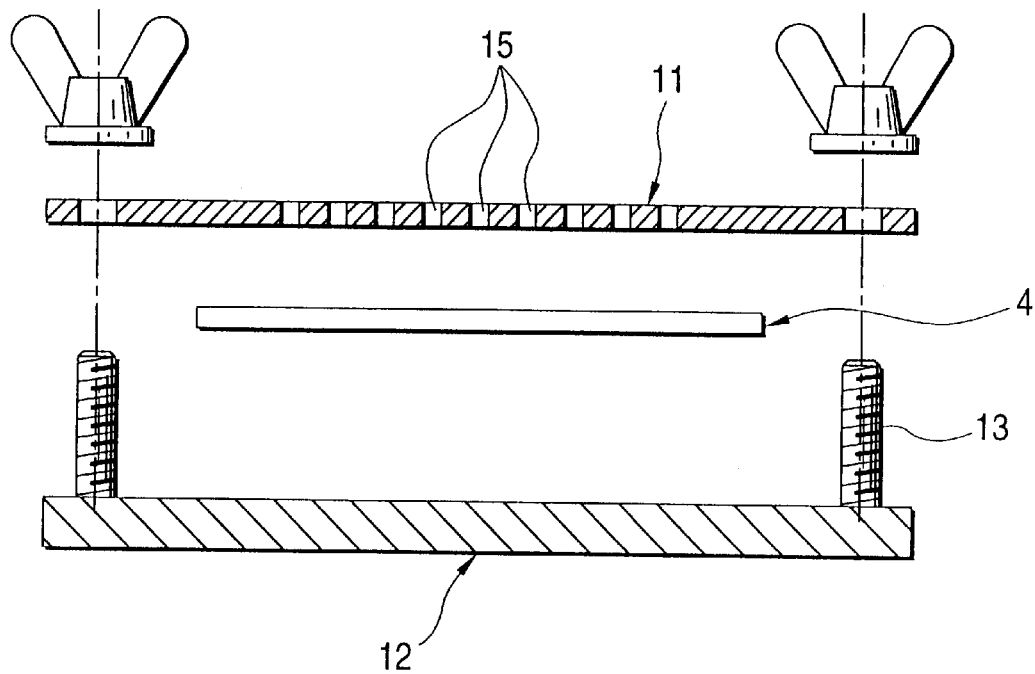
FIG. 3 is a sectional view showing the fixed state of a glass mask and a semiconductor substrate in the embodiment.
Figure 4:
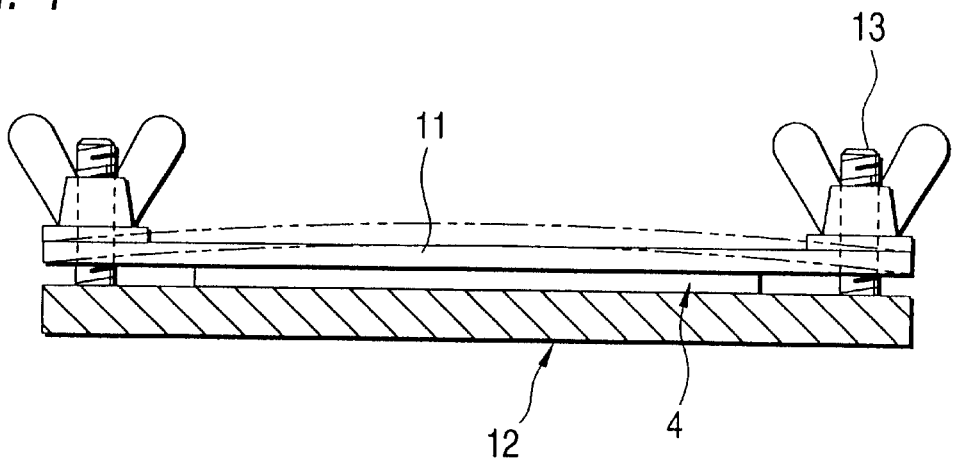
FIG. 4 is a front view showing the fixed state of a glass mask for deposition (hereinafter referred to as "deposition mask" or "glass mask") and a semiconductor substrate in the embodiment.
Figure 5:
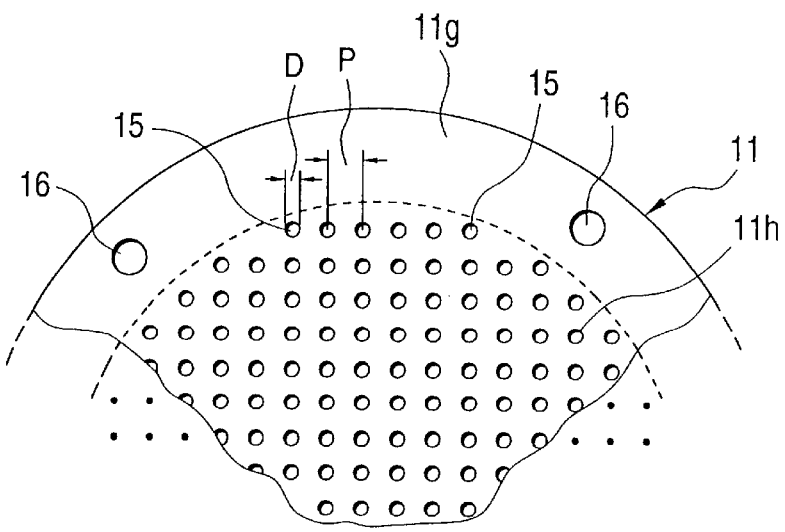
FIG. 5 is an enlarged plan view of a portion of a deposition mask in the embodiment shown in FIG. 1.
Figure 6:
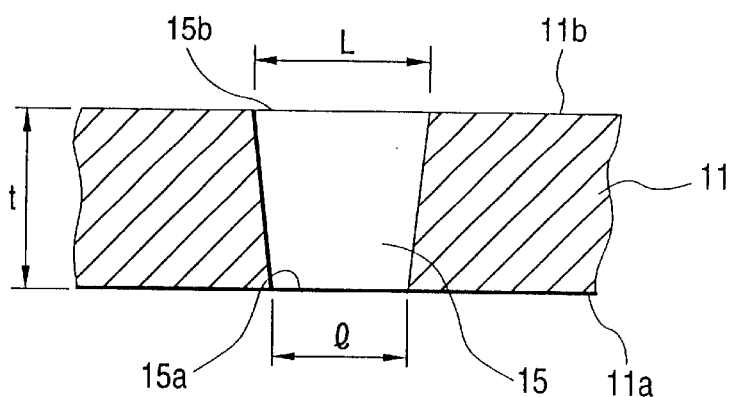
FIG. 6 is an enlarged sectional view of the through-hole of the deposition mask in the embodiment shown in FIG. 5.
Figure 21:
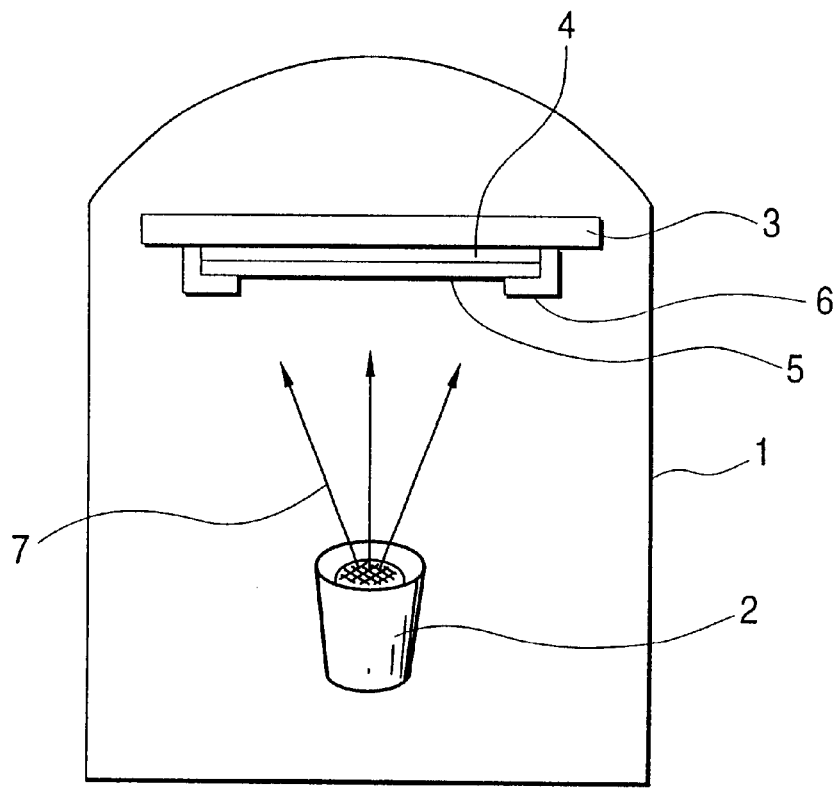
FIG. 21 is a schematic plan view showing a conventional deposition apparatus.
Figure 22:
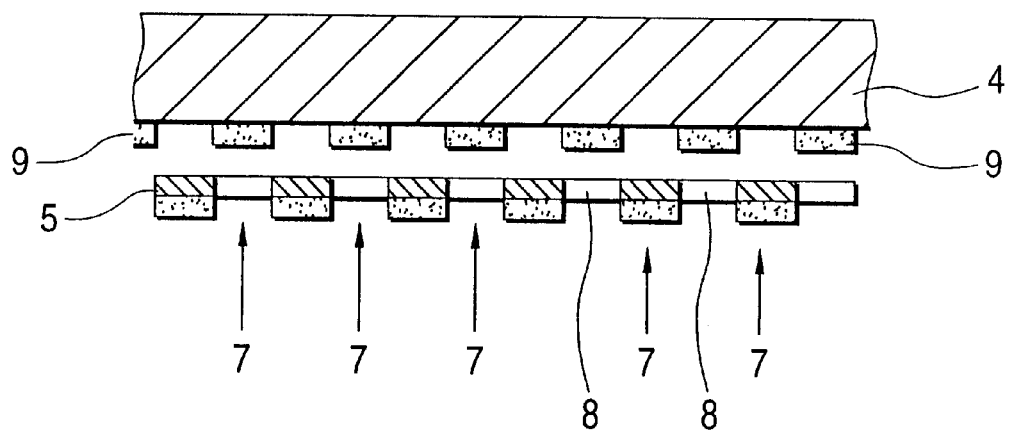
FIG. 22 is a sectional view showing the passing state of metallic particles in the conventional through-hole.

An explanation will be given of embodiments of the present invention. FIG. 1 is a schematic plan view of a deposition apparatus according to an embodiment of the present invention. FIGS. 2–4 are views showing the fixed state of a glass mask and a semiconductor substrate in the embodiment shown in FIG. 1. FIG. 5 is an enlarged plan view of a portion of a deposition mask in the embodiment shown in FIG. 1. FIG. 6 is an enlarged sectional view of the through-hole of the deposition mask in the embodiment shown in FIG. 5. In these figures, like reference numerals refer to like parts in the conventional deposition apparatus shown in FIG. 21.

FIG. 1 shows a vacuum deposition apparatus according to an embodiment of the present invention for forming electrodes on a semiconductor substrate surface on which compound semiconductor layers are stacked in order for forming a light emitting element (LED element). In FIG. 1, reference numeral 4 denotes a semiconductor substrate serving as light emitting semiconductor, 11 denotes a mask for deposition (hereinafter referred to as "deposition mask") located on the semiconductor substrate 4, 12 denotes a fixed stand which can swing by a prescribed angle with respect to an evaporated metal generating source (in a direction perpendicular to paper face), 13 denotes one of coil springs arranged outside the periphery of the semiconductor substrate 4, and 14 denotes one of ring-shaped spring receivers corresponding to the springs. In this embodiment, as seen from FIGS. 2–4, the deposition mask 11 is formed to have a larger diameter than that of the semiconductor substrate 4. The semiconductor substrate 4 and deposition mask 11 are fixed to the fixed stand 12 using spring force by the springs 13 and spring receivers 14.

Actually, for example, pins with their tips threaded are set up at plural positions properly spaced apart from one another of the ring-shaped spring receivers 14. The pins are passed through the coil springs 13, and through the holes made on the periphery of the deposition mask 11. The pins are further passed through the fixing holes made in the fixed stand 12. The threads at the tips of the pins are mated with butterfly nuts (not shown) on the back surface of the fixed stand. Although not shown, a spacer may be optionally arranged between the deposition mask 11 and the semiconductor substrate 4.

In this way, using the spring force, the semiconductor substrate 4 which is superposed on the deposition mask 11 is fixed on the fixed stand 12 so that alignment between the semiconductor substrate 4 and the deposition mask 11 can be easily made. Further, as described above, the deposition mask 11 has a larger diameter than that of the semiconductor substrate 4 and the fixing means are located in a region 11g outside an electrode forming region 11h of the deposition mask 11 so that the semiconductor substrate surface is not hindered by the fixing means and hence desired evaporated metal can be applied on the entire electrode forming region of the semiconductor substrate 4. This improves the production yield of the electrodes.

The deposition mask 11 is made of a glass plate having a thickness t of about 800 $\mu$m. As seen from FIG. 5, through-holes 15 each having a diameter D of about 100 $\mu$m for passing metal vapor are formed at predetermined intervals (pitches) of e.g. 260 $\mu$m on the substantially entire region of the deposition mask 11 which faces the semiconductor substrate 4. In this embodiment, the shape of the through-hole 15 is circular. Reference numeral 16 denotes a through-hole for fixing.

The deposition mask 11 having a large number of minute through-holes 15 is formed of photosensitive glass. The photosensitive glass may be silicate glass which can be obtained by molding a solution of metallic ions of e.g. Au, Ag and Cu with a sensitizing agent of $CeO_2$. The deposition mask can be manufactured by making the through-holes by photolithography.

Figure 9A:
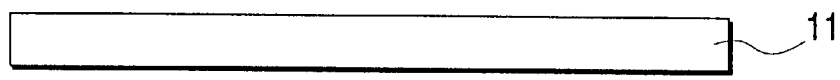
FIGS. 9A to 9C are sectional views for explaining a process of manufacturing a deposition mask.
Figure 9B:
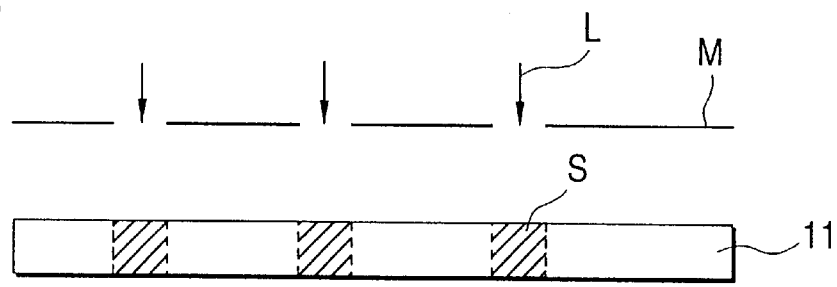
Figure 9C:
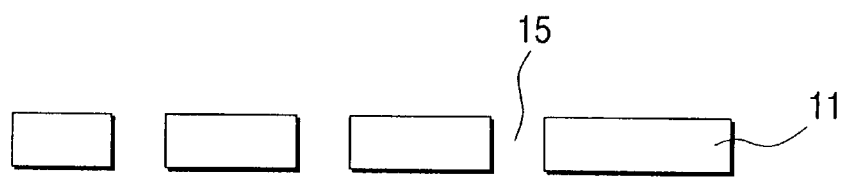

In a manufacturing process, as shown in FIG. 9A, both surfaces of the silicate glass are polished. As shown in FIG. 9B, the polished one glass surface is illuminated with ultraviolet rays through the corresponding master mask so that latent images S corresponding to the through-holes 15 of the deposition mask 11 are formed.

The non-exposed portions are also illuminated with the ultraviolet rays and made photosensitive by proper heat treatment (latent image portions) are crystallized so that they can be easily solved in acid. The crystallized portions are solved by acid, i.e. removed through chemical etching. Thus, the deposition mask having the through-holes 15 as shown is completed.

The deposition mask 11 (hereinafter also referred to as "glass mask" as necessary) thus completed is excellent in its physical and chemical property, and has a linear thermal expansion coefficient of $6.0 \times 10^{-6}$/K which is much smaller than that of Fe which is commonly used for the deposition mask. The glass mask 11 has a high rigidity coefficient of $10^5$ Kgf/cm$^2$.

The through-hole 15 of the glass mask 11 in this embodiment has a size as seen from FIG. 6. Specifically, it has a hole diameter l of about 100 $\mu$m in the opening face 15a flush with the plane 11a facing the deposition surface of the semiconductor substrate 4, and a hole diameter L of 180 $\mu$m in the opening face 15b flush with the plane 11b the opposite plane 11b from which atoms for deposition are introduced. The peripheral wall of the through-hole 15 has an inclination or tapering angle of about 3°.

The inclination angle of 3° is preferably maximized taking the pitch between the adjacent through-holes in consideration. In this embodiment, since the through-holes 15 each having the diameter l of about 100 $\mu$m are arranged at the pitch P of about 200 μm, the opening diameter L of 180 μm is a necessary value. Therefore, where the glass mask 11 has a thickness t of 800 μm, the inclination angle of about 3° results Such a degree of the inclination angle permits the electrodes to be uniformly in prescribed patterns on the semiconductor substrate surface, and suppresses the evaporated metallic atoms from being deposited on the peripheral wall of the through-hole 15.

Figure 8A:
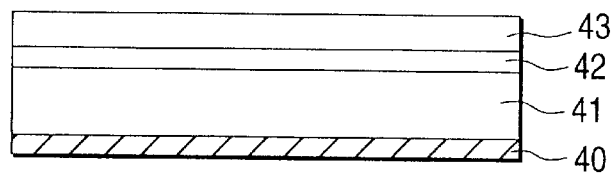
FIGS. 8A to 8E are sectional views for explaining a process of manufacturing an LED element.

An explanation will be given of the process of depositing electrode metal such as Au on the deposition surface of the semiconductor substrate 4 using the glass mask 11 manufactured as described above. First, the semiconductor substrate 4 as shown in FIG. 8A is prepared. It may be a semiconductor wafer in which an N-type GaP layer 42 and P-type GaP 43 are formed in order on a GaP substrate 41. Electrode 40 made of AuGeNi layer is formed on a back side of the GaP substrate 41.

Figure 8B:
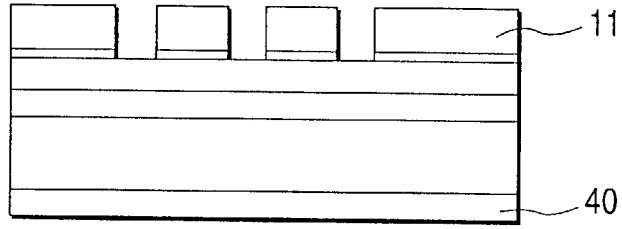

The semiconductor substrate is placed on the fixed stand 12 of the vacuum deposition apparatus as shown in FIG. 1–4. The deposition mask 11 is placed on the P-type GaP layer 43. The peripheral edge of the deposition mask 11, which is outside the surface of the semiconductor substrate 4, is fixed by the springs 13 and spring receivers 14 (FIG. 8B).

Figure 8C:
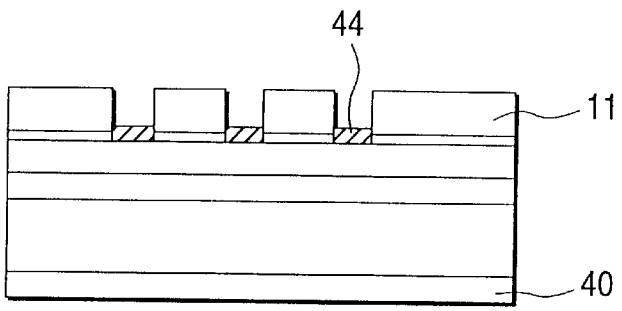

With the interior of the bell jar evacuated to the degree of $10^{-3}$ to $10^{-4}$ Torr, heaters for first to third evaporation sources (Au, Be and Ni) (not shown) are turned on. Thus, evaporated Au, Be and Ni atoms 7 are generated within a vacuum atmosphere from the evaporation source 2, and pass through each of the through-holes 15 to reach the P-type GaP layer 43. Thus, an AuBeNi layer 44 having a thickness of 100–5000Å is formed as shown in FIG. 8C.

Figure 8D:
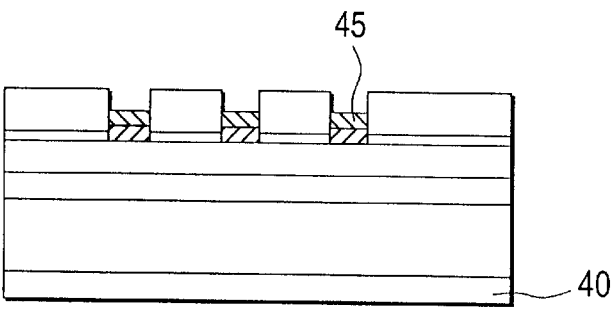

Subsequently, the heater for a fourth evaporation source (Ti) (not shown) is turned on. Thus, evaporated Ti atoms are generated in a vacuum atmosphere from the evaporation source, and pass through each of the through-holes 15 to reach the AuBeNi layer 44. Thus, a Ti layer 45 having a thickness of 10–1000 Å is formed as shown in FIG. 8D.

Figure 8E:
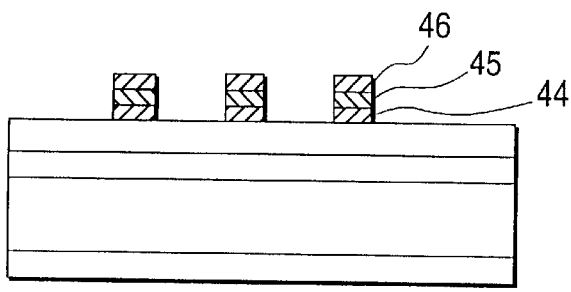

Further, the heater for a fifth evaporation source (Au) (not shown) is turned on. Thus, evaporated Au atoms are generated in a vacuum atmosphere from the evaporation source, and pass through each of the through-holes 15 to reach the Ti layer 45. Thus, an Au layer 46 having a thickness of is formed as shown in FIG. 8E.

Finally, the vacuum state of the bell jar is canceled. The glass mask is removed from the semiconductor substrate 4. Turning the semiconductor substrate upside down, another glass mask is mounted on the semiconductor substrate. In the same manner as described above, electrodes 40 of AuBeNi is also formed on the back face of the semiconductor substrate. It is diced into plural chips of LED elements each having a single electrode on the front surface and plural electrodes on the back surface.

In this way, the LED element, having an electrode pattern composed of three layers of the AuBeNi layer 44, Ti layer 45 serving as a barrier layer and the Au layer 46 which is a low resistant layer, can be completed. This LED element has no fear of being doped into the P-type GaP layer 43 and has an improved contact property therewith. The total thickness of the electrode was 1 μm. The high precision of the electrode pattern was maintained during the process of forming the electrode. The deposition time of several minutes to several tens of minutes was taken for each layer.

The glass mask 11 deposited on the semiconductor substrate surface, which has a very small thermal linear expansion coefficient of $10^{-5}$ to $10^{-6}$ which is approximately equal to that of the GaP substrate, does not become deformed due to the thermal expansion during the deposition. For this reason, the electrodes can be precisely formed at prescribed positions of the surface of the semiconductor substrate. Meanwhile, in the prior art, since the electrode having a three-layer structure has a larger thickness, thick photoresist was correspondingly required in photolithography. This leads to insufficient pattern precision in many cases. In addition, in order to etch three kinds of metals, the corresponding enchants must be prepared. Further, using the metals such as Mo and Ti, which are difficult to etch, the electrode pattern cannot be easily formed. Particularly, using Mo, which is very difficult to etch, the electrode pattern cannot be easily formed. On the other hand, in accordance with the present invention, by using the glass mask as described above, the electrode pattern can be very easily formed.

In the above embodiment, the method of manufacturing the LED element was described. However, the above method can be adopted to manufacture other semiconductor devices such as an IC.

Further, the deposition mask in this embodiment was used to form a thin film pattern such as the electrode pattern in the vacuum deposition. However, it may be used other deposition techniques inclusive of a physical deposition technique such as sputtering and chemical deposition technique such as CVD and MBE.

The deposition mask can be also used as a etching mask.

Figure 7:
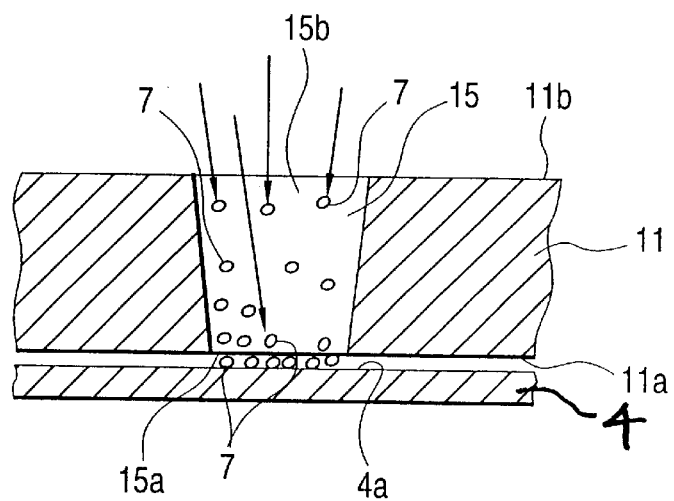
FIG. 7 is a sectional view showing the passing state of metallic particles in the through-hole in FIG. 6.

The peripheral wall of the through-hole 15 of the glass mask 11 is inclined so that the opening face 15b from which the evaporated atoms are introduced has a larger diameter than that of the opening face 15a on the side of the deposition surface of the semiconductor substrate. Therefore, as seen from FIG. 7, the evaporated atoms 7 flying aslant toward the opening face 15b do not form the "shade" at the peripheral edge of the opening face 15, but can be deposited on the deposition surface 4a of the semiconductor substrate 4.

The opening face 15a on the deposition side has a shape corresponding to the pattern of the metallic film deposited on the surface of the semiconductor substrate 4. Therefore, the metallic film can be deposited in accordance with a prescribed pattern on the deposition surface 4a of the semiconductor substrate 4. The evaporated atoms 7 having flied aslant toward the opening face 15b can be captured so that labor of making the particle line of the evaporated metallic atoms 7 perpendicular to the surface 4a of the semiconductor substrate 4 can be relaxed.

Figure 10:
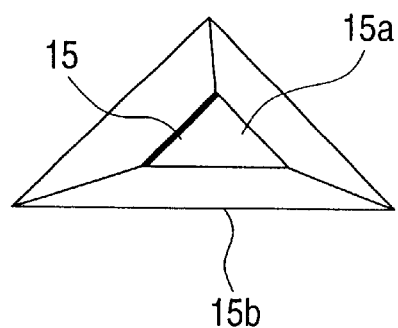
FIG. 10 is a plan view of the through-hole of a deposition mask according another embodiment of the present invention.
Figure 11:
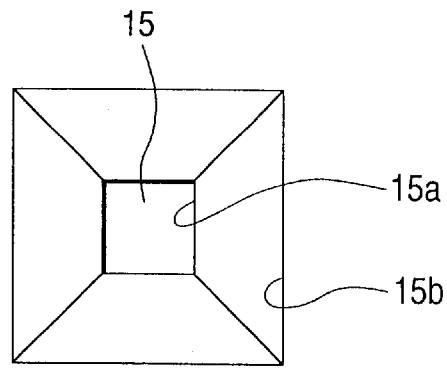
FIG. 11 is a plan view of the through-hole of a deposition mask according still another embodiment of the present invention.
Figure 12:
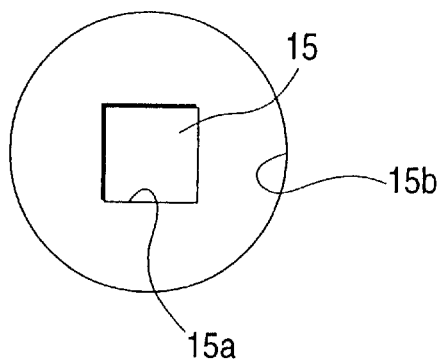
FIG. 12 is a plan view of the through-hole of a deposition mask according a further embodiment of the present invention.

In this embodiment, the through-hole 15 of the glass mask 11 has an inverted conical shape in which both opening faces 15a and 15b are circular and the former is smaller than the latter. However, as seen from plan views of FIGS. 10 and 11, the through-hole 15 may have an inverted triangle shape and an inverted square shape. Further, as seen from a plan view of FIG. 13, the through-hole 15 may have a shape with the opening faces 15a and 15b being square and circular, respectively.

Even when the through-hole having several kinds of shapes described above is used, the evaporated atoms 7 having flied aslant toward the opening face 15b do not form the "shade" at the peripheral edge of the opening face 15, but can be uniformly deposited on the deposition surface 4a of the semiconductor substrate 4, thus providing the same effect as the glass mask 11 described above. Further, the peripheral wall of the through-hole may be a vertical wall with no gradient.

Meanwhile, in several embodiments of the through-hole 15, where the peripheral wall of the through-hole 15 is inclined or tapered, the peripheral edge or corner of the opening 15a on the deposition side has an acute knife-edge sectional shape. Therefore, the corner is slightly fragile due to shock and aptly to break. In order to overcome such an inconvenience, as shown in FIG. 13, the corner 15c of the opening face 15a is uprighted vertically to have a certain thickness.

Figure 13:
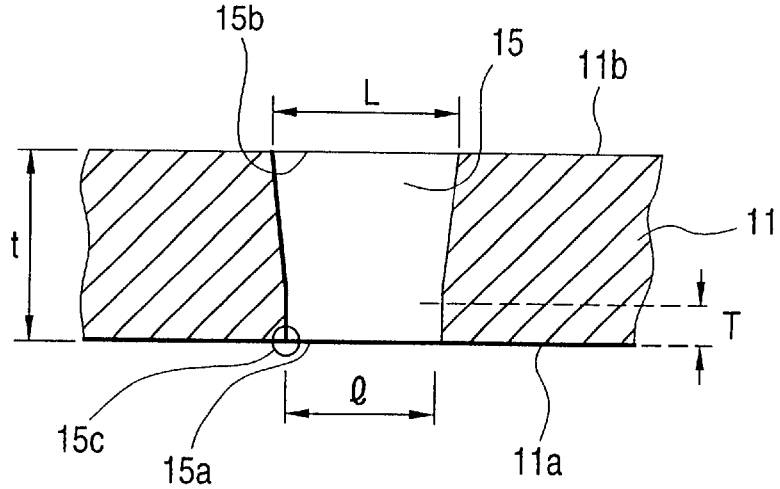
FIG. 13 is an view of the through-hole of a deposition mask according a further embodiment of the present invention.

FIG. 13 is an enlarged sectional view of an example of the glass mask 11.

The through-hole 15 of the glass mask 11 in this embodiment has a size as seen from FIG. 13 like that shown in FIG 6. Specifically, it has a height of 800 μm, a hole diameter 1 of about 100 μm in the opening face 15a flush with the plane 11a facing the deposition surface 4a of the semiconductor substrate 4, and a hole diameter L of 180 μm in the opening face 15b flush with the plane 11b the opposite plane 11b from which atoms for deposition are introduced. The peripheral edge 15c in the opening face 15a is designed to have an uprighting portion having a height of T of 10 μm which is vertical toward the opening face 15b.

Specifically, the peripheral wall of the through-hole 15 is vertically formed with no gradient at the edge of the opening face 15a. The sectional shape of the through-hole 15 is designed in a funnel shape. In this way, even if the peripheral wall of the through-hole is tapered, the portion of the peripheral edge 15c is still thick. For this reason, the glass mask 11 can have large strength to shock. The evaporated atoms are captured through the tapered wall from a wide area and further vertically guided through the vertical wall to the surface of the semiconductor substrate. This permits the electrode pattern to be formed precisely. Incidentally, the thickness of the glass mask is preferably 600–800 μm. The height or thickness of the uprighting portion is preferably 10–30 μm.

In each of the embodiments described above, where the peripheral wall of the through-hole 15 is tapered, the opening face 15b from which the evaporated atoms are introduced has a larger diameter than that of the opening face 15a flush with the plane 11a facing the deposition surface 4a of the semiconductor substrate 4. Therefore, the front face of the glass mask 11 must be discriminated from the back face facing the semiconductor substrate 4. Examples of the shape for discrimination are shown in FIGS. 14 and 15.

Figure 14:
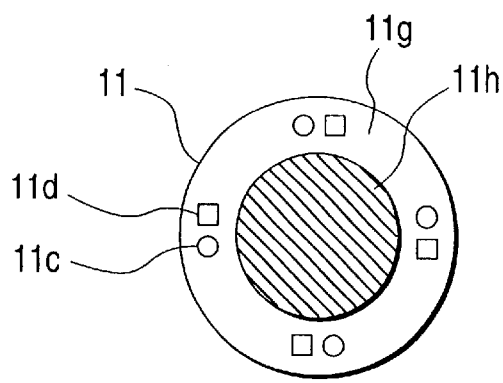
FIG. 14 is a plan view of an embodiment for discriminating the front surface of the deposition mask according to the present invention from the back surface thereof.

FIG. 14 shows an example of a circular glass mask 11. The glass mask 11 is formed slightly larger than the semiconductor substrate 4. The glass mask 11 is composed of a region 11h where the through-holes 15 are formed to deposit the metallic film in a prescribed pattern on the deposition surface of the semiconductor substrate and a region 11g surrounding the region 11h where no through-hole are formed. A discriminating means having circular holes 11c and square holes 11d is provided. The manner of arranging the circular holes 11c and square holes 11d permits the front surface of the mask 11 from the back surface thereof.

Figure 15:
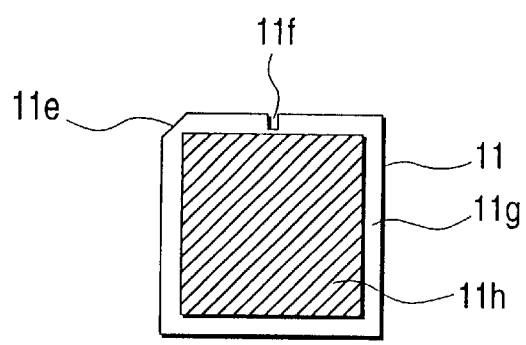
FIG. 15 is a plan view of another embodiment for discriminating the front surface of the deposition mask according to the present invention from the back surface thereof.

FIG. 15 shows an example of a square glass mask 11. The glass mask 11 is formed to have a slightly longer side than that of the semiconductor substrate 4. The glass mask 11 is composed of a region 11h where the through-holes 15 are formed to deposit the metallic film in a prescribed pattern on the deposition surface of the semiconductor substrate and a region 11g surrounding the region 11h where no through-hole are formed. A discriminating means having a recess 11e formed at a corner and another recess 11e formed in one side successive to the recess 11e is provided. This discriminating means permits the front surface of the glass mask 11 to be discriminated from the back surface thereof.

By forming such holes or recesses on the evaporation mask and forming the protrusions to be engaged with these holes or recesses on the member, i.e. fixed stand on which the glass mask is located, the glass mask can be set on the fixed stand without failing to recognize the front surface and back surface of the glass mask. This also easily prevents misalignment.

Figure 16:
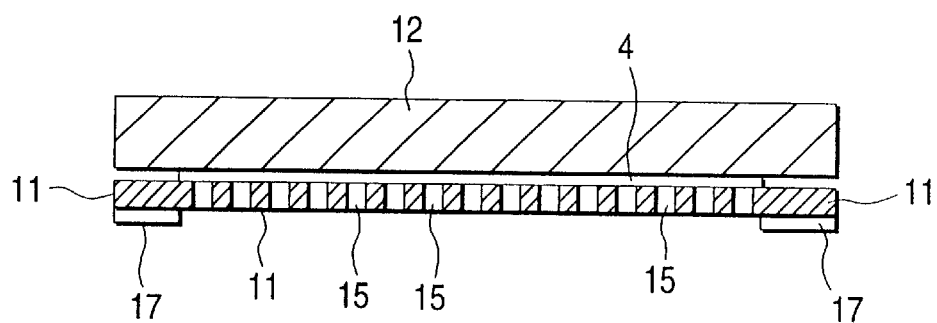
FIG. 16 is a sectional view showing an embodiment of attaching the deposition mask according to the present invention to a fixed stand of a deposition apparatus.

FIG. 16 shows another embodiment of a structure for attaching a deposition mask on a fixed stand of a deposition apparatus. In FIG. 16, reference numeral 12 denotes a fixed stand for a deposition apparatus, and 17 denotes a magnet. The fixed stand 12 is made of a magnetic substance. With magnets located on the peripheral edges of the deposition mask 11, the semiconductor substrate 4 and deposition mask 11 are fixed on the stand by means of magnetic force. With the magnet located on the fixed stand 12, the semiconductor substrate 4 and deposition mask 11 may be fixed using another magnetic material. This provides the same effect as fixing the semiconductor substrate 4 and deposition mask 11 using the spring force. Incidentally, in this case, any optional spacer (not shown) may be arranged between the deposition mask 11 and the semiconductor substrate 4 as occasion demands.

Figure 17:
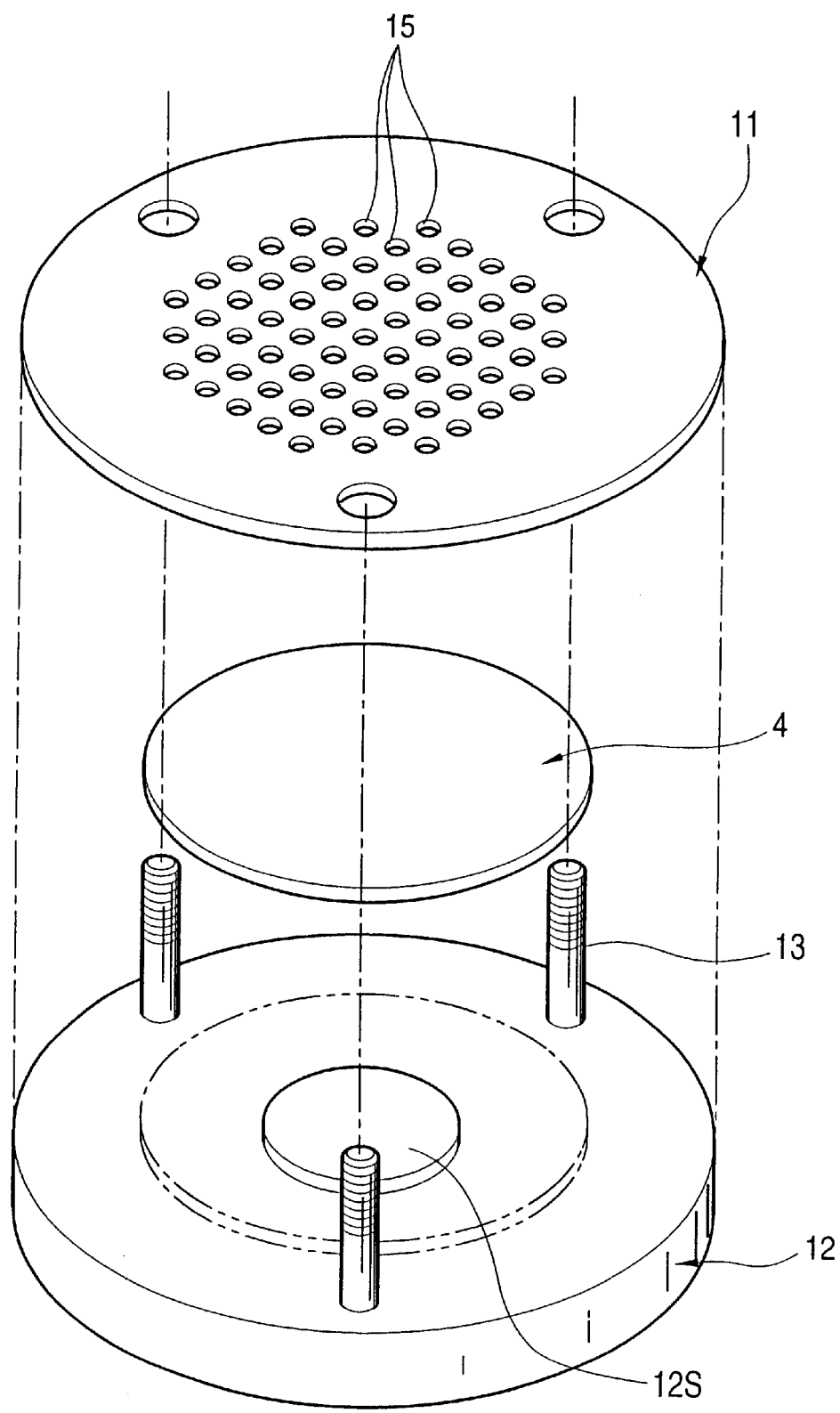
FIG. 17 is a perspective view showing the fixed state of a glass mask and a semiconductor substrate in another embodiment of the present invention.
Figure 18:
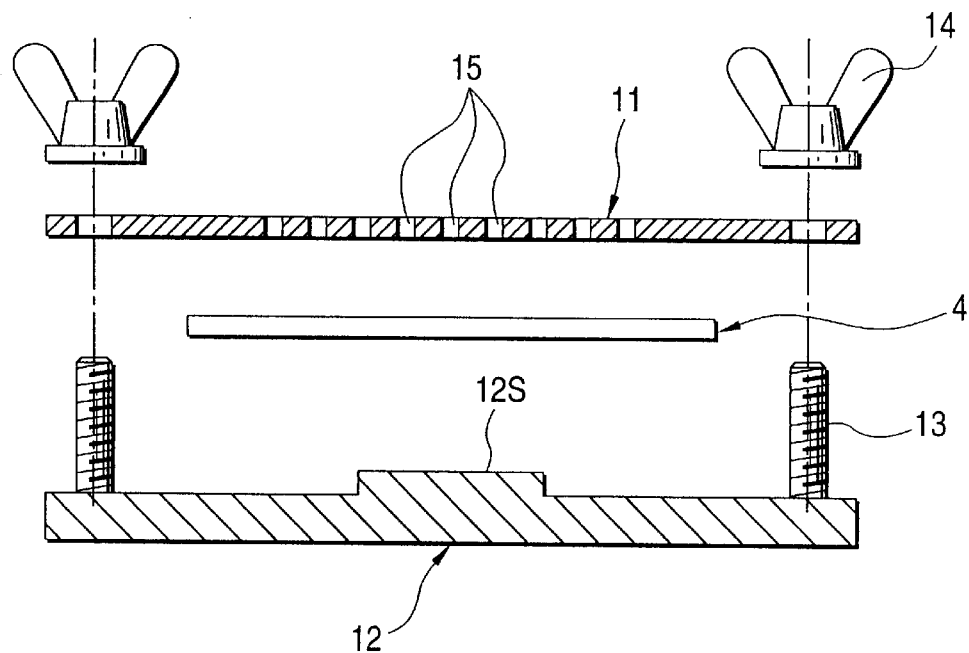
FIG. 18 is a sectional view showing the fixed state of a glass mask and a semiconductor substrate in the embodiment of the FIG. 17.
Figure 19:
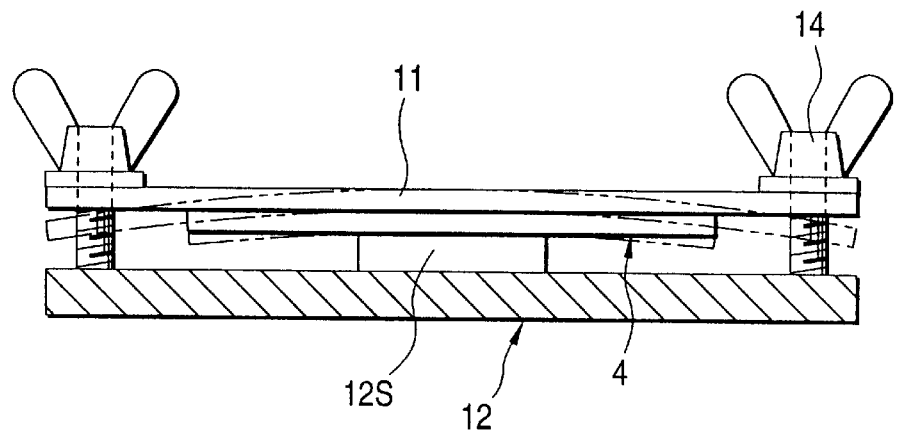
FIG. 19 is a front view showing the fixed state of a glass mask and a semiconductor substrate in the embodiment of FIG. 7.

Referring to FIGS. 17–19, an explanation will be given of another embodiment of the present invention. This embodiment is characterized in that a protrusion 12s is formed on the surface of a fixed stand 12 for mounting the semiconductor substrate 4 on the assumption of warp of a glass mask 11 so that the semiconductor substrate is convex upwards. The glass mask can be fixed on the stand 12 in the same manner as described in FIGS. 2–4. The semiconductor substrate 4 is placed on the fixed stand 12, and the glass mask 11 is thereafter superposed on the semiconductor substrate 4. The glass mask 11 is tightened at plural positions on its periphery toward the fixed stand by the fixing means such as bolts 13.

At this time, the glass mask 11 is warped to be convex upward so that its central portion becomes high. The semiconductor substrate 4 is also warped to be convex upward its central portion along the surface shape of the fixed stand 12. In other words, both glass mask 11 and semiconductor substrate 4 are simultaneously warped to be convex upward in a state where they are kept in substantially intimate contact with each other, as indicated by two-dot chain line in FIG. 19. Therefore, the central portion of the glass mask 11 does not substantially float separately from the surface of the semiconductor substrate 4.

Figure 20:
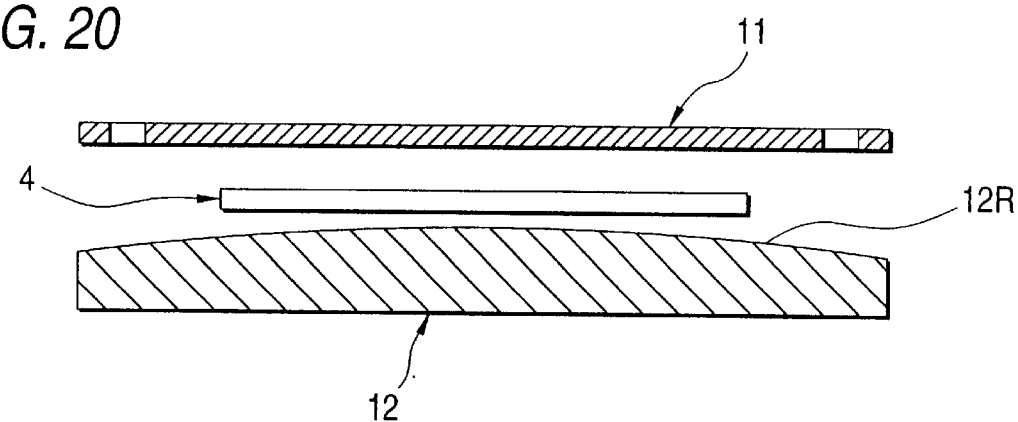
FIG. 20 is a sectional view showing the fixed state of a glass mask and a semiconductor substrate in still another embodiment.

The fixed stand may form a surface shape of not only a convex as in this embodiment, but also a gently-sloping sphere 12R as in FIG. 20 showing a modification.

Adoption of the fixed stand having such a configuration can remove warp of the glass mask due to not only its fixing on the stand but also its thermal expansion, thereby forming the thin film pattern at high precision.

In each of the embodiments described above, concrete numerical values were proposed. However, these numerical values are reference values so that the present invention should not be limited to these values. With respect to the shape of the through-hole and others, the present invention should not be limited to those proposed in each of the embodiments described hitherto.

As described above, in accordance with the present invention, a thin film pattern inclusive of an electrode pattern can be easily formed on the surface of a semiconductor substrate, thereby improving the production yield of a semiconductor device.

What is claimed is:

1. A method of manufacturing a semiconductor device comprising the steps:

fixing a glass mask having a through-hole superposed on a surface of a semiconductor substrate; and arranging the glass mask and semiconductor substrate within a material gas containing material particles so that said material gas is passed through said through-hole and brought into contact with the surface of said semiconductor substrate to form a thin film pattern.

2. A method of manufacturing a semiconductor device according to claim 1, wherein said material gas is metal vapor and the metal vapor is brought into contact with the surface of said semiconductor substrate through said glass mask to form a thin film pattern.

3. A method of manufacturing a semiconductor device according to claim 1 wherein said material gas is metal vapor and the metal vapor is brought into contact with the surface of said semiconductor substrate through said glass mask to form a metal thin film pattern.

4. A method of manufacturing a semiconductor device according to claim 1, wherein said semiconductor substrate includes a layer of compound semiconductor selected from the group consisting of GaAs, GaP or InP, said material gas is metal vapor, and the metal vapor is brought into contact with the surface of said semiconductor substrate through said glass mask to form an electrode pattern.

5. A method of manufacturing a semiconductor device according to claim 1, wherein said semiconductor substrate includes a layer of compound semiconductor selected from the group consisting of GaAs, GaP or InP to form an LED element, said glass mask includes a plurality of through-holes arranged regularly each having substantially the same diameter; and the material gas is brought into contact with the surface of said semiconductor substrate through said glass mask to form an electrode pattern.

6. A method of manufacturing a semiconductor device according to claim 5, wherein said glass mask includes the plurality of through-holes arranged at a higher density on its periphery than at its center.

7. A method of manufacturing a semiconductor device according to claim 5, wherein said glass mask includes the plurality of through-holes each having a larger diameter on its periphery than at its center.

8. A method of manufacturing a semiconductor device according to claim 6, wherein said glass mask includes the plurality of through-holes each having a larger diameter on its periphery than at its center.

9. A method of manufacturing a semiconductor device according to claim 1, wherein said semiconductor substrate and said glass mask superposed thereon are fixed on a stand which can swing.

10. A method of manufacturing a semiconductor device according to claim 1, wherein said glass film is fixed on a supporting stand by means of an elastic member.

11. A method of manufacturing a semiconductor device according to claim 1, wherein said glass mask is fixed on the supporting stand by means of an attaching means formed so as to extend from an outer periphery of said semiconductor substrate.

12. A method of manufacturing a semiconductor device according to claim 1, wherein said semiconductor substrate is placed on supporting stand whose center portion is higher than the other portion in their positions, said glass mask is superposed on the semiconductor substrate, said glass mask is fixed, together with said semiconductor substrate, at positions outside an periphery of the semiconductor substrate.

13. A method of manufacturing a semiconductor device according to claim 1, wherein said material gas is evaporated from a plurality evaporation sources, and flies substantially perpendicular to said semiconductor substrate.

* * * * *